US012772687B2

(12) United States Patent
Lee et al.

(10) Patent No.: US 12,772,687 B2
(45) **Date of Patent: *Oct. 20, 2026**

(54) DISPLAY PANEL

(71) Applicant: Samsung Display Co., Ltd., Yongin-si (KR)

(72) Inventors: Sangshin Lee, Yongin-si (KR); Seungjin Lee, Yongin-si (KR); Yeonju Kang, Yongin-si (KR); Sanghoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 470 days.

This patent is subject to a terminal disclaimer.

(21) Appl. No.: 18/471,822

(22) Filed: Sep. 21, 2023

(65) Prior Publication Data

US 2024/0276822 A1 Aug. 15, 2024

(30) Foreign Application Priority Data

Feb. 13, 2023 (KR) ........................ 10-2023-0018858

(51) Int. Cl.
*H10K 59/35* (2023.01)

(52) U.S. Cl.
CPC ......... *H10K 59/352* (2023.02); *H10K 59/351* (2023.02)

(58) Field of Classification Search
CPC ........................... H10K 59/352; H10K 59/351
USPC ........................................................... 313/500
See application file for complete search history.

(56) References Cited

U.S. PATENT DOCUMENTS 10,446,620 B2 * 10/2019 Jun ........................ H10K 59/38
10,840,306 B2 11/2020 Kim
2019/0173042 A1 * 6/2019 Lim ..................... H10K 59/131
2021/0066419 A1 * 3/2021 Byun .................. H10K 59/122
(Continued)

FOREIGN PATENT DOCUMENTS

CN 110767708 B 5/2022
EP 4312482 A1 1/2024
(Continued)

OTHER PUBLICATIONS

K-PION Patent File Wrapper Search (Year: 2026).*
(Continued)

*Primary Examiner* — James R Greece
*Assistant Examiner* — Hana S Featherly
(74) *Attorney, Agent, or Firm* — Womble Bond Dickinson (US) LLP

(57) ABSTRACT

A display panel includes: a unit pixel area defined along a first direction and a second direction that is perpendicular to the first direction, wherein, in the unit pixel area, a first display element configured to emit light of a first color and a second display element configured to emit light of a second color are arranged adjacent to each other along the first direction, and a third display element configured to emit light of a third color is arranged adjacent to the first display element and the second display element along the second direction, and a third emission area corresponding to the third display element comprises a 3-1st sub-emission area and a 3-2nd sub-emission area on one pixel electrode, and the 3-1st sub-emission area and the 3-2nd sub-emission area each have a closed curve shape.

20 Claims, 25 Drawing Sheets

(56) References Cited

U.S. PATENT DOCUMENTS

| | | | |
|---|---|---|---|
| 2021/0249482 A1 | 8/2021 | Lee et al. |
| 2022/0020826 A1 | 1/2022 | Lee et al. |
| 2022/0115612 A1 | 4/2022 | Ahn et al. |
| 2023/0045221 A1 | 2/2023 | Joo et al. |
| 2024/0040847 A1 | 2/2024 | Im et al. |
| 2024/0135852 A1 | 4/2024 | Lee et al. |

FOREIGN PATENT DOCUMENTS

| | | |
|---|---|---|
| EP | 4362643 A1 | 5/2024 |
| KR | 10-1958434 B1 | 3/2019 |
| KR | 10-2180558 B1 | 11/2020 |
| KR | 10-2393319 B1 | 5/2022 |

OTHER PUBLICATIONS

EPO Extended European Search Report dated Jul. 9, 2024, issued in corresponding European Patent Application No. 24150774.8, 12 pages.

* cited by examiner

DISPLAY PANEL

CROSS-REFERENCE TO RELATED APPLICATION

The present application claims priority to and the benefit of Korean Patent Application No. 10-2023-0018858, filed on Feb. 13, 2023, in the Korean Intellectual Property Office, the entire disclosure of which is incorporated herein by reference.

BACKGROUND

1. Field

Aspects of one or more embodiments relate to a display panel and a display apparatus including the same.

2. Description of the Related Art

Recently, the various uses of display apparatuses has diversified. In addition, as display apparatuses have become relatively thinner and lighter, their range of uses has gradually expanded.

As display apparatuses are used for various purposes, various methods of designing shapes of display apparatuses have been developed, and the number of functions that may be combined or associated with display apparatuses has increased.

The above information disclosed in this Background section is only for enhancement of understanding of the background and therefore the information discussed in this Background section does not necessarily constitute prior art.

SUMMARY

Aspects of one or more embodiments include a display apparatus with relatively reduced aperture ratio loss and relatively improved display quality. However, such an objective is only an example, and the scope of embodiments according to the present disclosure is not limited thereto.

Additional aspects will be set forth in part in the description which follows and, in part, will be apparent from the description, or may be learned by practice of the presented embodiments of the disclosure.

According to one or more embodiments, a display panel includes a unit pixel area defined along a first direction and a second direction that is perpendicular to the first direction, wherein, in the unit pixel area, a first display element configured to emit light of a first color and a second display element configured to emit light of a second color are arranged adjacent to each other in the first direction, and a third display element configured to emit light of a third color is arranged adjacent to the first display element and the second display element in the second direction, and a third emission area corresponding to the third display element includes a 3-1st sub-emission area and a 3-2nd sub-emission area on one pixel electrode, and the 3-1st sub-emission area and the 3-2nd sub-emission area each have a closed curve shape.

According to some embodiments, a first emission area corresponding to the first display element and a second emission area corresponding to the second display element may each have a circular shape.

According to some embodiments, a size of the first emission area may be less than a size of the second emission area.

According to some embodiments, the 3-1st sub-emission area may be adjacent to the first emission area, and the 3-2nd sub-emission area may be adjacent to the second emission area, and a size of the 3-1st sub-emission area may be less than a size of the 3-2nd sub-emission area.

According to some embodiments, a first emission area corresponding to the first display element and a second emission area corresponding to the second display element may each have a non-circular closed curve shape.

According to some embodiments, the 3-1st sub-emission area and the 3-2nd sub-emission area may be connected to each other to form a non-circular closed curve shape.

According to some embodiments, the 3-1st sub-emission area may be inscribed in a circle having a first radius, and the 3-2nd sub-emission area may be inscribed in a circle having a second radius that is smaller than the first radius, to form a dumbbell shape.

According to some embodiments, a first emission area corresponding to the first display element may include a 1-1st sub-emission area and a 1-2nd sub-emission area on one pixel electrode, and the 1-1st sub-emission area and the 1-2nd sub-emission area may each have a closed curve shape.

According to some embodiments, a second emission area corresponding to the second display element may include a 2-1 st sub-emission area and a 2-2nd sub-emission area on one pixel electrode, and the 2-1st sub-emission area and the 2-2nd sub-emission area may each have a closed curve shape.

According to some embodiments, the first color may be red, the second color may be green, and the third color may be blue.

According to one or more embodiments, a display panel includes a unit pixel area defined along a first direction and a second direction that is perpendicular to the first direction, wherein, in the unit pixel area, a first display element configured to emit light of a first color, a second display element configured to emit light of a second color, and a third display element configured to emit light of a third color are arranged in a diagonal direction, and a first emission area corresponding to the first display element includes a 1-1st sub-emission area and a 1-2nd sub-emission area on one pixel electrode to be apart from each other, and the 1-1st sub-emission area and the 1-2nd sub-emission area each have a closed curve shape.

According to some embodiments, the 1-1st sub-emission area and the 1-2nd sub-emission area may each have a circular shape.

According to some embodiments, the 1-1st sub-emission area and the 1-2nd sub-emission area may each have a non-circular closed curve shape.

According to some embodiments, a second emission area corresponding to the second display element may include a 2-1 st sub-emission area and a 2-2nd sub-emission area on one pixel electrode to be apart from each other, and the 2-1 st sub-emission area and the 2-2nd sub-emission area may each have a closed curve shape.

According to some embodiments, the 2-1 st sub-emission area and the 2-2nd sub-emission area may each have a circular shape.

According to some embodiments, the 2-1 st sub-emission area and the 2-2nd sub-emission area may each have a non-circular closed curve shape.

According to some embodiments, a size of a third emission area corresponding to the third display element may be greater than a size of a second emission area corresponding to the second display element.

According to some embodiments, a second emission area corresponding to the second display element may have a non-circular closed curve shape.

According to some embodiments, a third emission area corresponding to the third display element may have a donut shape.

According to some embodiments, the first color may be red, the second color may be green, and the third color may be blue.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
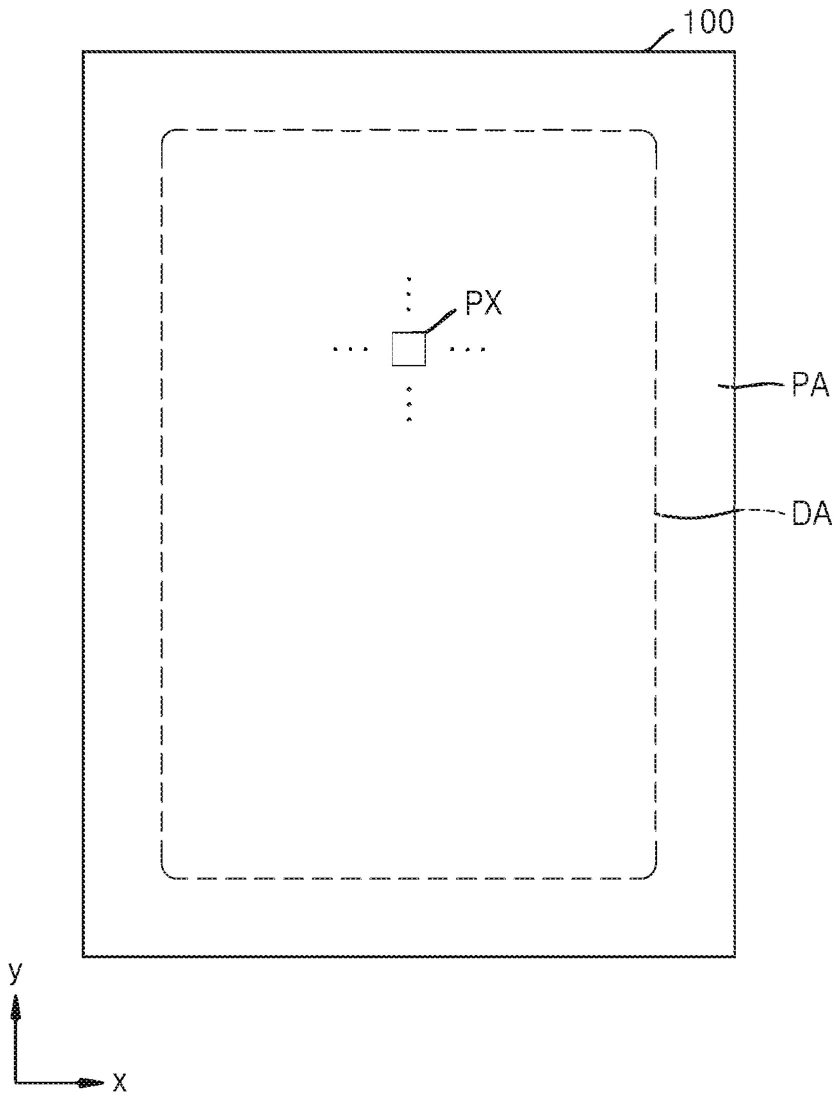
FIG. 1 is a plan view schematically illustrating a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, embodiments according to the present disclosure are not limited to the following embodiments and may be embodied in various forms.

In the following embodiments, although the terms "first," "second," etc., may be used to describe various elements, such elements should not be limited to the above terms. The above terms are used to distinguish one element from another.

In the following embodiments, an expression used in the singular encompasses the expression of the plural, unless it has a clearly different meaning in the context.

In the following embodiments, terms such as "include" or "comprise" may be construed to denote a certain characteristic or element, or any combinations thereof, but may not be construed to exclude the existence of or a possibility of addition of one or more other characteristics, elements, or any combinations thereof.

In the following embodiments, when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of description. For example, because sizes and thicknesses of elements in the drawings are arbitrarily illustrated for convenience of description, the disclosure is not limited thereto.

As used herein, the expression "A and/or B" means only A, only B, or both A and B. As used herein, the expression "at least one of A and B" means A or B, or A and B.

In the following embodiments, when a wiring is referred to as "extending in a first direction or a second direction," it means that the wiring not only extends in a straight line shape but also extends in a zigzag or in a curve in the first direction or the second direction.

In the following embodiments, the expression "in a plan view" means that an objective portion is viewed from above, and the expression "in a cross-sectional view" means that a cross-section of an objective portion taken vertically is viewed from a lateral side. In the following embodiments, when a first element "overlaps" a second element, the first element may be located on or below the second element.

Figure 2:
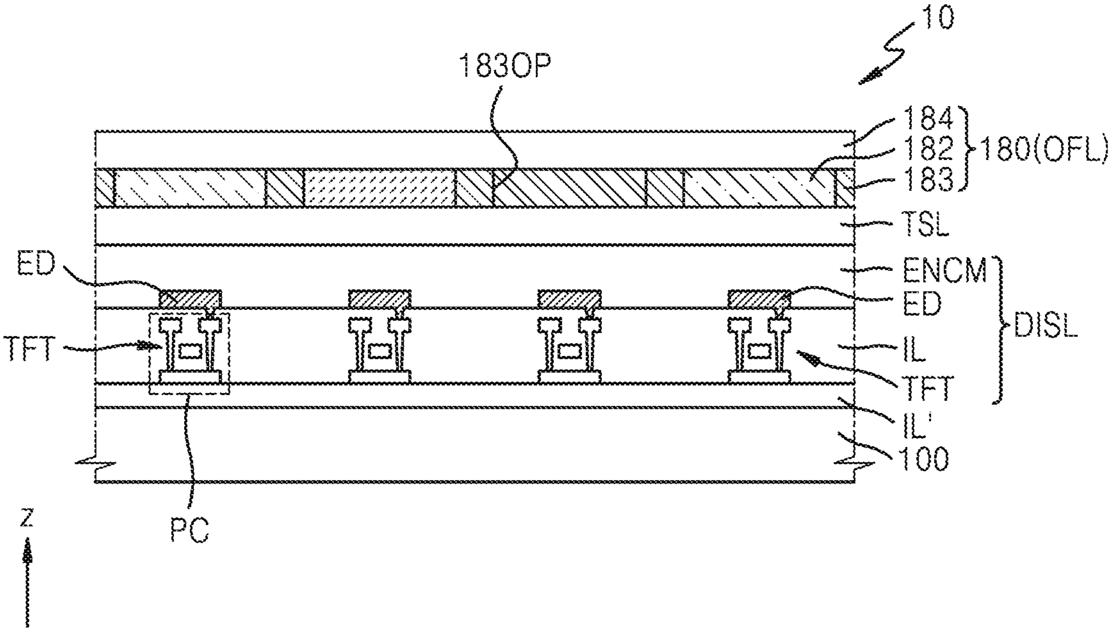
FIGS. 2 to 4 are cross-sectional views schematically illustrating a portion of a cross section of a display apparatus according to some embodiments.
Figure 3:
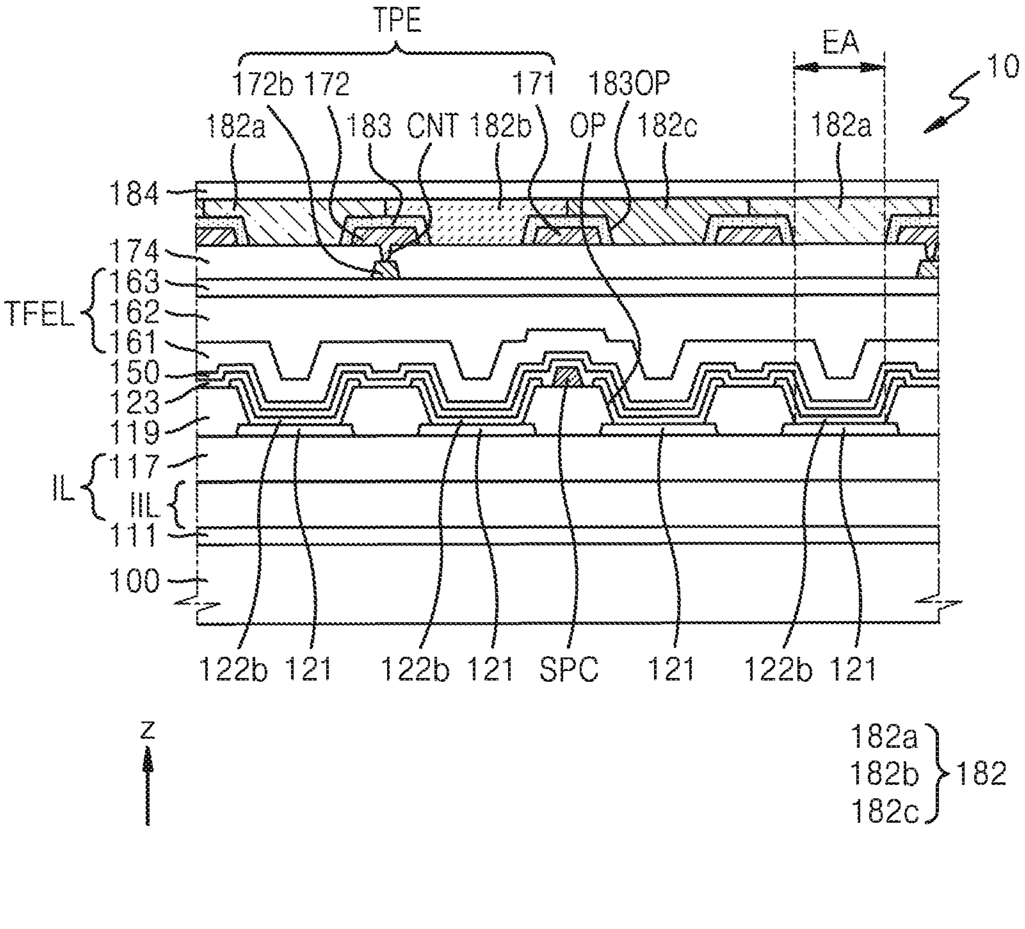
Figure 4:
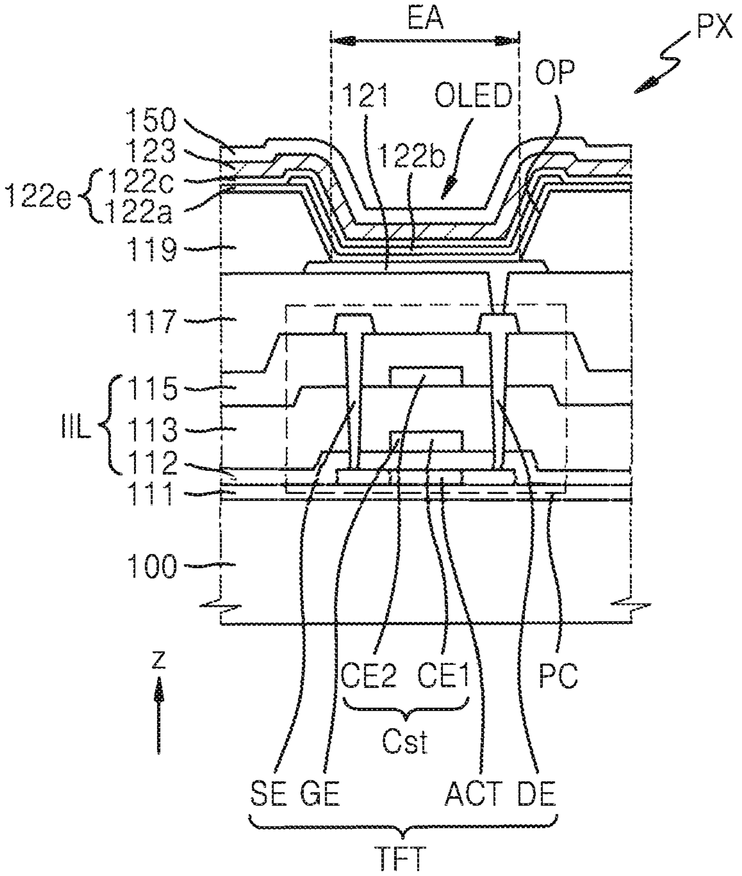

FIG. 1 is a plan view schematically illustrating a display apparatus according to some embodiments. FIGS. 2 to 4 are cross-sectional views schematically illustrating a portion of a cross section of the display apparatus according to some embodiments.

Referring to FIG. 1, the display apparatus may include a display panel 10, and a cover window for protecting the display panel 10 may be further located above the display panel 10.

The display panel 10 may include a display area DA, at which images are displayed, and a peripheral area PA outside (e.g., in a periphery or outside a footprint of) the display area DA in a plan view (e.g., a view perpendicular or normal with respect to a display surface of the display area DA). The peripheral area PA may be a type of non-display area in which pixels PX are not arranged and images are not displayed. The display area DA may be entirely surrounded by the peripheral area PA. Various components constituting the display panel 10 are located on a substrate 100. Accordingly, it may be understood that the substrate 100 includes the display area DA and the peripheral area PA.

A plurality of pixels PX may be arranged in the display area DA. The pixel PX may include a display element. The display element may be connected to a pixel circuit driving the pixel PX. According to some embodiments, the display element may be an organic light-emitting diode. Each pixel PX may emit, for example, red, green, blue, or white light through the organic light-emitting diode.

In a plan view of the display area DA, the display area DA may have a rectangular shape, as illustrated in FIG. 1. Embodiments according to the present disclosure are not limited thereto, however. For example, according to some embodiments, the display area DA may have a polygonal shape such as a triangular, pentagonal, or hexagonal shape, a circular shape, an elliptical shape, an irregular shape, or any other shape in a plan view according to the design of the display apparatus.

The peripheral area PA is arranged around the display area DA, and may be an area at which images are not displayed. Various wirings configured to transmit electrical signals to be applied to the display area DA, external circuits electrically connected to pixel circuits, and pads to which a printed circuit board or a driver integrated circuit (IC) chip is attached may be arranged in the peripheral area PA.

Referring to FIGS. 2 and 3, the display panel 10 may include the substrate 100 and a display layer DISL, a touch screen layer TSL, and an optical functional layer OFL above the substrate 100.

The display layer DISL may include a pixel circuit PC including a thin-film transistor TFT, a light-emitting element ED that is a display element, and an encapsulation member ENCM such as a thin-film encapsulation layer TFEL or an encapsulation substrate. Insulating layers IL and IL' may be arranged between the substrate 100 and the display layer DISL and inside the display layer DISL. In FIG. 3, the pixel circuit PC is omitted for convenience of illustration.

The substrate 100 may be a single layer including glass. Alternatively, the substrate 100 may include a polymer resin. The substrate 100 including polymer resin may have a multi-layer structure in which an organic layer and an inorganic layer including the polymer resin are stacked. The substrate 100 may be a rigid substrate or a flexible substrate that is bendable, foldable, or rollable.

A buffer layer 111, an inorganic insulating layer IIL, and a planarization layer 117 may be sequentially stacked on the substrate 100. The planarization layer 117 may include an organic material or an inorganic material, and may have a single-layer structure or a multi-layer structure. The pixel circuit PC may be arranged between the buffer layer 111 and the planarization layer 117. As illustrated in FIG. 4, the pixel circuit PC may include the thin-film transistor TFT and a capacitor Cst (and may include, for example, one or more other components).

The thin-film transistor TFT may include a semiconductor layer ACT including an organic semiconductor material such as amorphous silicon, polycrystalline silicon, or an oxide semiconductor, a gate electrode GE, a source electrode SE, and a drain electrode DE. The capacitor Cst may include a lower electrode CE1 and an upper electrode CE2.

The semiconductor layer ACT may be located on the buffer layer 111. A first insulating layer 112 may be arranged between the semiconductor layer ACT and the gate electrode GE. A second insulating layer 113 may be located on the gate electrode GE, and the upper electrode CE2 of the capacitor Cst may be located on the second insulating layer 113. The upper electrode CE2 may overlap the gate electrode GE thereunder. The gate electrode GE and the upper electrode CE2 overlapping each other with the second insulating layer 113 therebetween may constitute the capacitor Cst. The gate electrode GE may be the lower electrode CE1 of the capacitor Cst. A third insulating layer 115 may be located on the capacitor Cst, and the source electrode SE and the drain electrode DE may be located on the third insulating layer 115.

Each of the first insulating layer 112, the second insulating layer 113, and the third insulating layer 115 may include an inorganic material such as silicon oxide, silicon nitride, and/or silicon oxynitride. The first insulating layer 112, the second insulating layer 113, and the third insulating layer 115 may be collectively referred to as the inorganic insulating layer IIL.

The buffer layer 111 including an inorganic material such as silicon oxide, silicon nitride, and/or silicon oxynitride may be arranged between the thin-film transistor TFT and the substrate 100.

The planarization layer 117 may be located on the thin-film transistor TFT. The planarization layer 117 may include, for example, an organic insulating material such as acryl, benzocyclobutene (BCB), or hexamethyldisiloxane (HMDSO). Meanwhile, the planarization layer 117 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or zinc peroxide ($ZnO_2$). When forming the planarization layer 117, chemical mechanical polishing may be performed on an upper surface of a layer to provide a flat upper surface after the layer is formed. The planarization layer 117 may be a single layer or a multi-layer.

As the light-emitting element ED, an organic light-emitting diode OLED that is a display element may be located on the planarization layer 117. The organic light-emitting diode OLED may include a pixel electrode 121, a counter electrode 123, and an intermediate layer between the pixel electrode 121 and the counter electrode 123.

The pixel electrode 121 may be located on the planarization layer 117, and the pixel electrode 121 may contact the source electrode SE or the drain electrode DE through a via hole of the planarization layer 117 to be electrically connected to the thin-film transistor TFT.

A pixel definition layer 119 may be located on the planarization layer 117. The pixel definition layer 119 may cover an edge of the pixel electrode 121, and may have an opening OP exposing a portion of the pixel electrode 121. The size and shape of an emission area EA of the organic light-emitting diode OLED may be defined by the opening OP.

The pixel definition layer 119 may include a transparent insulating material or an opaque insulating material. According to some embodiments, the pixel definition layer 119 may include an organic insulating material such as polyimide, polyamide, acrylic resin, benzocyclobutene, HMDSO, or phenolic resin. According to some embodiments, the pixel definition layer 119 may include an inorganic insulating material such as silicon nitride or silicon oxide, or may include an organic insulating material and an inorganic insulating material.

In some embodiments, the pixel definition layer 119 may include a light-blocking material, and may have a black color. The light-blocking material may include carbon black, carbon nanotubes, resin or paste including black dye, metal particles (e.g., nickel, aluminum, molybdenum, and an alloy thereof), metal oxide particles (e.g., chrome oxide), or metal nitride particles (e.g., chrome nitride). When the pixel definition layer 119 includes a light-blocking material, external light reflection by metal structures located under the pixel definition layer 119 may be relatively reduced, which may improve display quality of the display apparatus.

As illustrated in FIG. 3, a spacer SPC may be further located on the pixel definition layer 119. According to some embodiments, the spacer SPC may include the same material as that of the pixel definition layer 119. In this case, the pixel definition layer 119 and the spacer SPC may be formed together in a mask process using a halftone mask or the like, such that the spacer SPC may have an island shape protruding from the pixel definition layer 119 at a certain interval in a z direction. According to some embodiments, the spacer SPC may include a material different from that of the pixel definition layer 119. In this case, the spacer SPC may include island-shaped insulating patterns located on the pixel definition layer 119 at certain intervals.

As illustrated in FIG. 4, the intermediate layer may include an emission layer **122*b* and an organic functional layer 122*e* on and/or under the emission layer 122*b***.

The emission layers **122*b* may be arranged in the opening OP of the pixel definition layer 119 to correspond to the pixel electrode 121. The emission layer 122*b*** may include a high molecular weight material or a low molecular weight material, and may emit red, green, blue, or white light.

The organic functional layer **122*e* may include a first functional layer 122*a* and/or a second functional layer 122*c*. The first functional layer 122*a* or the second functional layer 122*c*** may be omitted.

The first functional layer **122*a* may be located under the emission layer 122*b*. The first functional layer 122*a* may be a single layer or multi-layer including an organic material. The first functional layer 122*a* may be a hole transport layer (HTL) having a single-layer structure. Alternatively, the first functional layer 122*a* may include a hole injection layer (HIL) and an HTL. The first functional layer 122*a*** may be integrally formed to correspond to the organic light-emitting diodes OLED included in the display area DA.

The second functional layer **122*c* may be located on the emission layer 122*b*. The second functional layer 122*c* may be a single layer or multi-layer including an organic material. The second functional layer 122*c* may include an electron transport layer (ETL) and/or an electron injection layer (EIL). The second functional layer 122*c*** may be integrally formed to correspond to the organic light-emitting diodes OLED included in the display area DA.

The counter electrode 123 may be located above the emission layer **122*b*. An upper layer 150 including an organic material may be located on the counter electrode 123**.

According to some embodiments, the intermediate layer may include two or more emitting units sequentially stacked between the pixel electrode 121 and the counter electrode 123, and a charge generation layer CGL arranged between two emitting units. When the intermediate layer includes an emitting unit and a charge generation layer, the organic light-emitting diode OLED may be a tandem light-emitting element. The organic light-emitting diode OLED may have relatively improved color purity and emission efficiency by having a stacked structure of a plurality of emitting units.

One emitting unit may include an emission layer and a first functional layer and a second functional layer respectively arranged under and on the emission layer. The charge generation layer CGL may include a negative charge generation layer and a positive charge generation layer. The emission efficiency of the organic light-emitting diode OLED, which is a tandem light-emitting element having a plurality of emission layers, may be further increased by the negative charge generation layer and the positive charge generation layer. The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

The upper layer 150 may be a layer provided to protect the counter electrode 123 and increase light extraction efficiency. The upper layer 150 may include lithium fluoride (LiF). Alternatively, the upper layer 150 may further include an inorganic insulating material such as silicon oxide ($SiO_x$) or silicon nitride ($SiN_x$).

Display elements may be covered with the thin-film encapsulation layer TFEL. According to some embodiments, the thin-film encapsulation layer TFEL may include at least one inorganic encapsulation layer and at least one organic encapsulation layer. For example, the thin-film encapsulation layer TFEL may include first and second inorganic encapsulation layers 161 and 163 and an organic encapsulation layer 162 therebetween.

The touch screen layer TSL may be located on the second inorganic encapsulation layer 163. The touch screen layer TSL may obtain coordinate information according to an external input, for example, a touch event. The touch screen layer TSL may sense an external input by using a self-capacitance method or a mutual capacitance method. The touch screen layer TSL may include touch electrodes TPE and wirings connected to the touch electrodes TPE. The touch electrodes TPE may include first touch electrodes 171 and second touch electrodes 172. The first touch electrodes 171 may be connected to each other by connection electrodes arranged on the same layer. The second touch electrode 172 may be connected to a connection electrode **172*b*, which is arranged on a different layer from the second touch electrode 172, through a contact hole CNT of an insulating layer 174. The touch electrodes TPE may be located to correspond to the pixel definition layer 119**.

The optical functional layer OFL may include a filter layer 180 including a color filter 182, a black matrix 183, and an overcoat layer 184. The black matrix 183 may cover the first touch electrodes 171 and the second touch electrodes 172. The black matrix 183 may be located to correspond to the pixel definition layer 119. The overcoat layer 184 may include an organic material such as resin, and the organic material may be transparent.

In the display panel 10 using the color filter 182 and the black matrix 183 as the optical functional layer OFL instead of a polarizing plate or a polarizing film, the emission efficiency of a display element may be relatively improved so that power consumption may be relatively reduced and luminance may be increased, and thus, the lifespan of the display panel 10 may be relatively improved. In addition, the same or higher luminance/lifespan may be secured even with an emission area smaller than a conventional emission area. In addition, because a polarizing plate or a polarizing film may not be used, the thickness of the display panel 10 may be relatively reduced.

The color filter 182 may include a first color filter 182*a* that selectively transmits only light of a first color, a second color filter 182*b* that selectively transmits only light of a second color, and a third color filter 182*c* that selectively transmits only light of a third color. The first color filter 182*a*, the second color filter 182*b*, and the third color filter 182*c* may be arranged to correspond to the emission area EA of the pixel PX. The first color filter 182*a*, the second color filter 182*b*, and the third color filter 182*c* may be arranged adjacent to each other. Each of the first color filter 182*a*, the second color filter 182*b*, and the third color filter 182*c* may have an independent pattern structure. Each of the first color filter 182*a*, the second color filter 182*b*, and the third color filter 182*c* may be arranged in an opening 1830P of the black matrix 183. Each of the first color filter 182*a*, the second color filter 182*b*, and the third color filter 182*c* may partially overlap the pixel definition layer 119.

Figure 5:
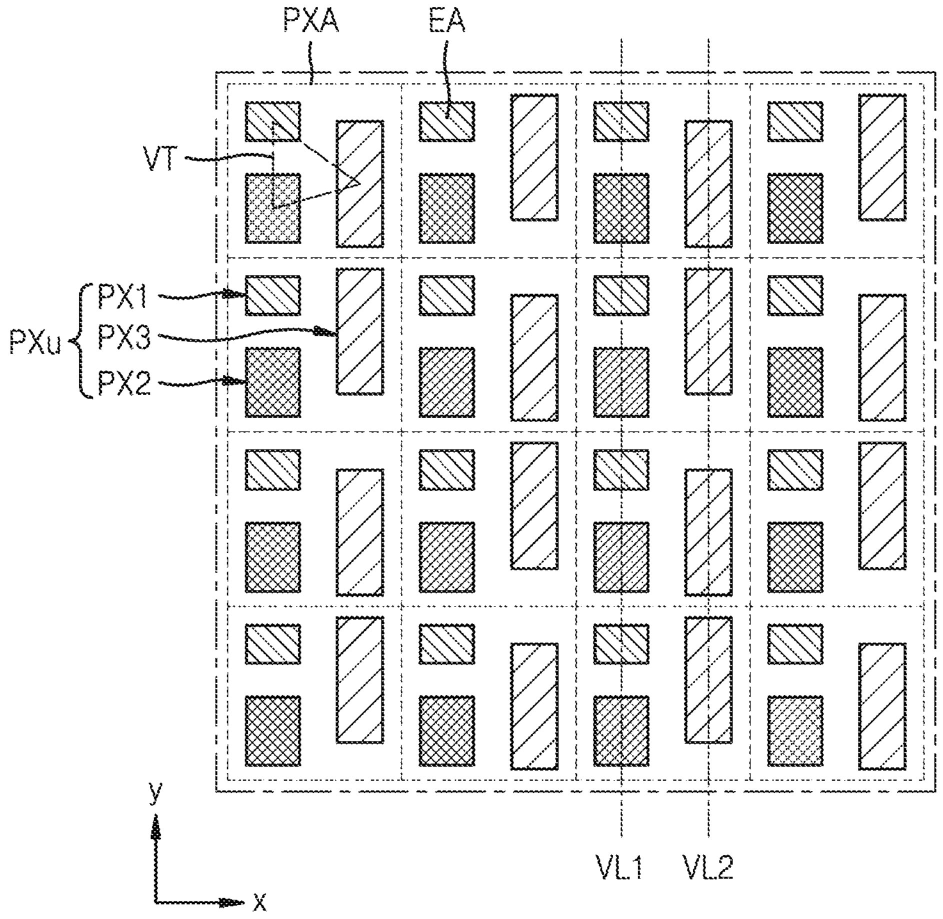
FIG. 5 is a diagram illustrating an arrangement of pixels according to some embodiments.

FIG. 5 is a diagram illustrating an arrangement of pixels according to some embodiments.

Unit pixel areas PXA may be defined in the display area DA of the display panel 10 along x and y directions, and unit pixels PXu may be arranged in the unit pixel area PXA. The unit pixel PXu may include a first pixel PX1, a second pixel PX2, and a third pixel PX3. According to some embodiments, the first pixel PX1 may be a red pixel emitting red light, the second pixel PX2 may be a green pixel emitting green light, and the third pixel PX3 may be a blue pixel emitting blue light. The first pixel PX1, the second pixel PX2, and the third pixel PX3 may each include the organic light-emitting diode OLED, which is a display element, and a pixel circuit to which the organic light-emitting diode OLED is connected.

In the unit pixel area PXA, display elements of the first pixel PX1, the second pixel PX2, and the third pixel PX3 may be arranged in a certain pattern according to a certain rule. According to some embodiments, the unit pixel area PXA may have a square shape.

The size and shape of the emission area EA of the organic light-emitting diode OLED are defined by the opening OP of the pixel definition layer 119, and the emission area EA is an area in which the emission layer of the organic light-emitting diode OLED is arranged. Accordingly, herein, an arrangement (placement) of pixels may refer to an arrangement (placement) of display elements, an arrangement (placement) of pixel electrodes, or an arrangement (placement) of emission areas. FIG. 5 illustrates the emission areas EA corresponding to the organic light-emitting diode OLED of the first pixel PX1, the organic light-emitting diode OLED of the second pixel PX2, and the organic light-emitting diode OLED of the third pixel PX3 arranged in the unit pixel area PXA.

According to some embodiments, as illustrated in FIG. 5, in the unit pixel area PXA, centers of the emission area EA of the first pixel PX1, the emission area EA of the second pixel PX2, and the emission area EA of the third pixel PX3 may be located at vertices of a virtual triangle VT. In the unit pixel area PXA, the emission area EA of the first pixel PX1 and the emission area EA of the second pixel PX2 may be arranged adjacent to each other in the y direction, and the emission area EA of the third pixel PX3 may be arranged adjacent to the emission areas EA of the first and second pixels PX1 and PX2 in the x direction. Accordingly, the emission area EA of the first pixel PX1 and the emission area EA of the second pixel PX2 may be alternately arranged in the y direction along a first virtual straight line VL1, and the emission area EA of the third pixel PX3 may be repeatedly arranged in the y direction along a second virtual straight line VL2.

The emission area EA of the first pixel PX1, the emission area EA of the second pixel PX2, and the emission area EA of the third pixel PX3 may have different lengths in the x direction and the y direction. For example, the emission area EA of the first pixel PX1 may have a quadrangular shape having a long side in the x direction, and the emission area EA of the second pixel PX2 and the emission area EA of the third pixel PX3 may each have a quadrangular shape having a long side in the y direction. The emission area EA of the first pixel PX1, the emission area EA of the second pixel PX2, and the emission area EA of the third pixel PX3 may have different ratios of the length in the x direction to the length in the y direction from each other. According to some embodiments, the emission area EA of the first pixel PX1 and/or the emission area EA of the second pixel PX2 may have a square shape having the same length in the x direction and the y direction. The length of the emission area EA of the third pixel PX3 in the y direction may be equal to or greater than the sum of the length of the emission area EA of the first pixel PX1 in the y direction and the length of the emission area EA of the second pixel PX2 in the y direction. The emission area EA having a quadrangular shape may include a quadrangular shape having round corners (vertices). According to some embodiments, the spacer SPC (see FIG. 3) may be arranged between the emission areas EA of one pair of third pixels PX3 and the emission areas EA of another pair of third pixels PX3 in the y direction.

The emission area EA of the first pixel PX1, the emission area EA of the second pixel PX2, and the emission area EA of the third pixel PX3 may have different areas (sizes) from each other. According to some embodiments, the emission area EA of the third pixel PX3 may have a greater area than the emission area EA of the first pixel PX1. In addition, the emission area EA of the third pixel PX3 may have a greater area than the emission area EA of the second pixel PX2. According to some embodiments, the emission area EA of the second pixel PX2 may have a greater area than the emission area EA of the first pixel PX1. According to some embodiments, the emission area EA of the first pixel PX1 may have the same area as the emission area EA of the second pixel PX2.

Figure 6A:
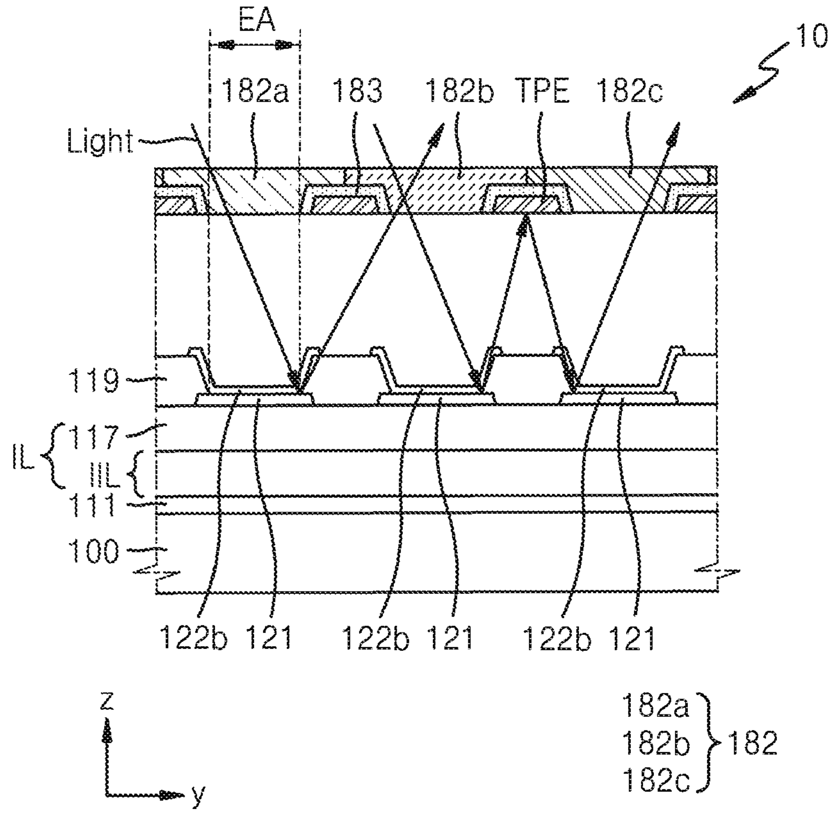
FIGS. 6A and 6B are diagrams illustrating an example of light reflection by an external light source according to some embodiments.
Figure 6B:
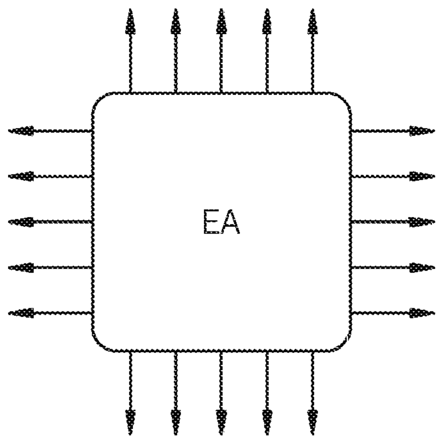

FIGS. 6A and 6B are diagrams illustrating an example of light reflection by an external light source. In FIG. 6A, some elements are omitted for convenience of illustration and description.

Referring to FIGS. 6A and 6B, in a case in which the shape of the emission area EA is a polygon composed of straight sides, as illustrated in FIG. 5, when a light source is incident on the display panel 10 in a black state, due to diffuse reflection at an edge of the pixel definition layer 119 having a straight shape, a linear reflective color band and a diffraction phenomenon may occur along an edge of the emission area EA or the pixel definition layer 119.

Figure 7A:
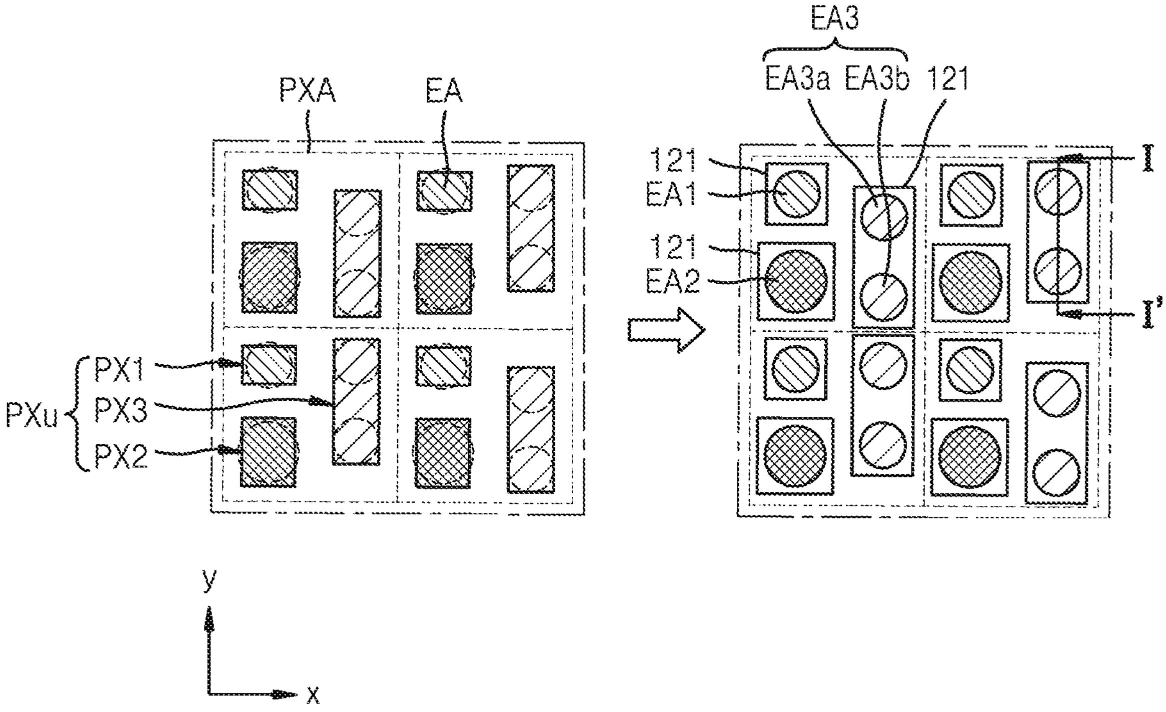
FIG. 7A is a diagram illustrating emission areas according to some embodiments.
Figure 7B:
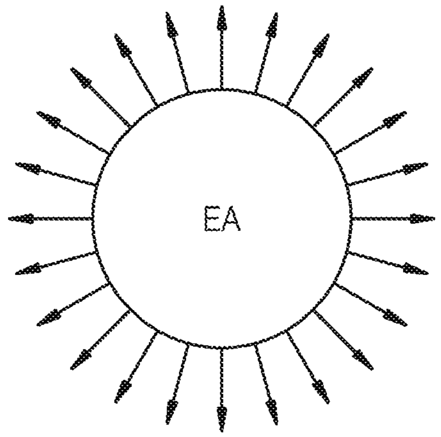
FIG. 7B is a diagram illustrating an example of light reflection by an external light source according to some embodiments.
Figure 7C:
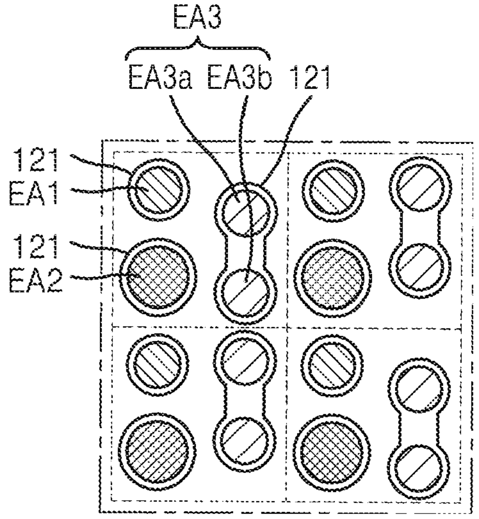
FIG. 7C is a diagram illustrating a modified example of a shape of a pixel electrode according to some embodiments as illustrated in FIG. 7A.
Figure 8:
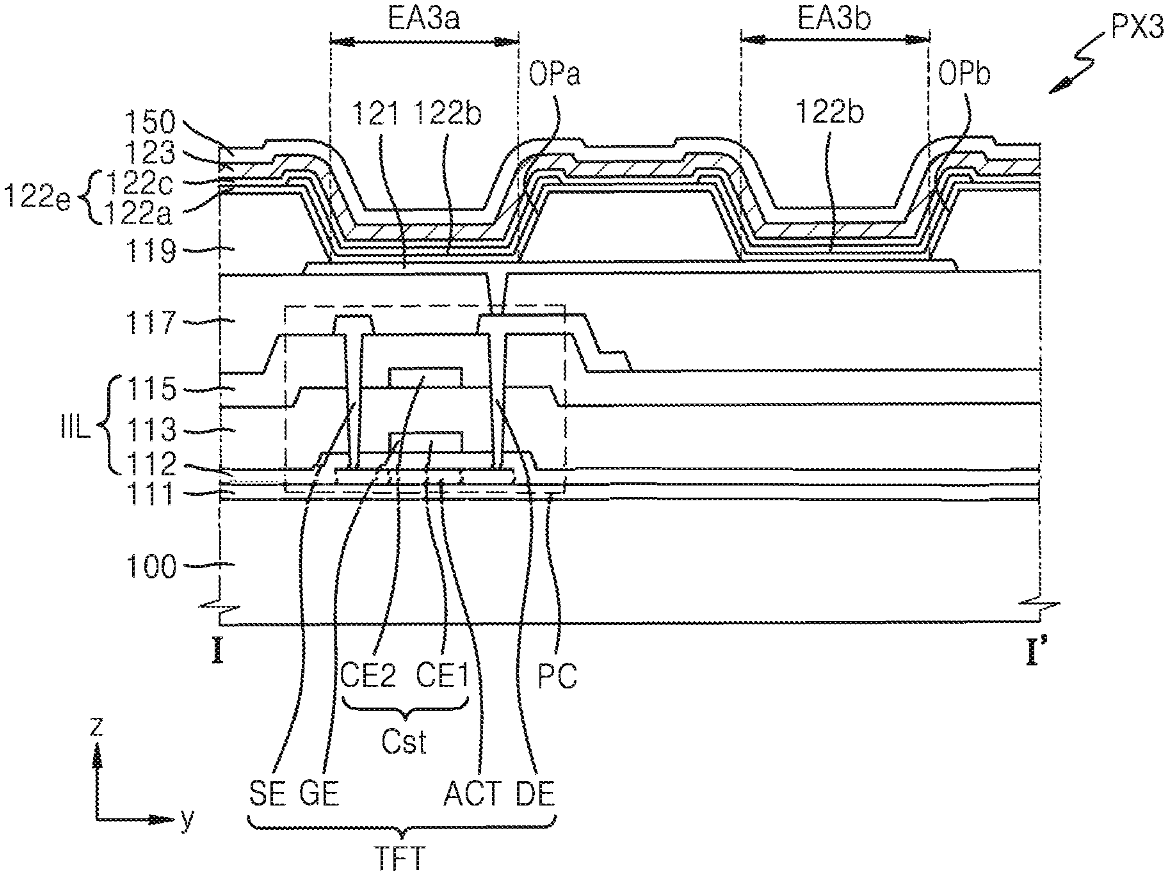
FIG. 8 is a cross-sectional view illustrating a region taken along the line I-I' of FIG. 7A according to some embodiments.

FIG. 7A is a diagram illustrating emission areas according to some embodiments. FIG. 7B is a diagram illustrating an example of light reflection by an external light source. FIG. 7C is a diagram illustrating a modified example of the shape of a pixel electrode according to some embodiments as illustrated in FIG. 7A. FIG. 8 is a cross-sectional view illustrating a region taken along the line I-I' of FIG. 7A.

According to some embodiments, the organic light-emitting diode OLED of the first pixel PX1, the organic light-emitting diode OLED of the second pixel PX2, and the organic light-emitting diode OLED of the third pixel PX3 may be arranged in the unit pixel area PXA, and a first emission area EA1 corresponding to the organic light-emitting diode OLED of the first pixel PX1 and a second emission area EA2 corresponding to the organic light-emitting diode OLED of the second pixel PX2 may each have a closed curve shape. A third emission area EA3 of the third pixel PX3 may include a 3-1st sub-emission area EA3*a* and a 3-2nd sub-emission area EA3*b* that are apart from each other, and the 3-1 st sub-emission area EA3*a* and the 3-2nd sub-emission area EA3*b* may each have a closed curve shape. For example, the first emission area EA1, the second emission area EA2, the 3-1st sub-emission area EA3*a*, and the 3-2nd sub-emission area EA3*b* may each have a circular shape.

Referring to FIG. 7A, the first emission area EA1 of the first pixel PX1 and the second emission area EA2 of the second pixel PX2, which have quadrangular shapes, may be changed to circular emission areas. In FIG. 7A, the radius of the second emission area EA2 of the second pixel PX2 is larger than the radius of the first emission area EA1 of the first pixel PX1, but the disclosure is not limited thereto. The radius of the second emission area EA2 may be variously changed, and for example, may be the same as or smaller than the radius of the first emission area EA1.

The third emission area EA3 of the third pixel PX3, which has a rectangular shape having a long side in the y direction, may be changed to a pair of circular sub-emission areas, that is, the 3-1 st and 3-2nd sub-emission areas EA3*a* and EA3*b* arranged adjacent to each other in the y direction. Accordingly, in the unit pixel area PXA, the first emission area EA1 of the first pixel PX1 and the 3-2nd sub-emission area EA3*b* of the third pixel PX3 may be arranged to face each other in a diagonal direction, and the second emission area EA2 of the second pixel PX2 and the 3-1st sub-emission area EA3*a* of the third pixel PX3 may be arranged to face each other in another diagonal direction. The pair of circular sub-emission areas, that is, the 3-1 st and 3-2nd sub-emission areas EA3*a* and EA3*b* may have the same radius. The pair of circular sub-emission areas, that is, the 3-1st and 3-2nd sub-emission areas EA3*a* and EA3*b* of the third pixel PX3 may each have the same radius as the radius of first emission area EA1 of the first pixel PX1.

The first pixel PX1, the second pixel PX2, and the third pixel PX3 may each include the organic light-emitting diode OLED, and the pixel electrode 121 of the organic light-emitting diode OLED may be located on the planarization layer 117. The pixel electrodes 121 of the first pixel PX1, the second pixel PX2, and the third pixel PX3 may each have a quadrangular shape different from the shapes of the corresponding emission areas. However, embodiments according to the present disclosure are not limited thereto.

As illustrated in FIG. 7C, the pixel electrodes 121 of the first pixel PX1, the second pixel PX2, and the third pixel PX3 may each have a shape similar to the shapes of the corresponding emission areas. The pixel electrode 121 of the first pixel PX1 and the pixel electrode 121 of the second pixel PX2 may each have a circular shape, and the pixel electrode 121 of the third pixel PX3 may have a dumbbell shape or a peanut shape having circular shapes arranged at both ends and a bridge portion connecting the two circular shapes to each other.

According to some embodiments, the pixel electrodes 121 of the first pixel PX1, the second pixel PX2, and the third pixel PX3 may each be variously changed to have, for example, a quadrangular shape having round corners or an elliptical shape. Meanwhile, the pixel electrode 121 may further include a contact hole connected to members located thereunder. In this case, the shape of a portion corresponding to the contact hole may be added to the pixel electrode 121.

According to some embodiments, the 3-1st sub-emission area EA3*a* and the 3-2nd sub-emission area EA3*b* that are apart from each other may be located on the pixel electrode 121 of the third pixel PX3. As illustrated in FIG. 8, the pixel electrode 121 of the third pixel PX3 may contact the source electrode SE or the drain electrode DE through the via hole of the planarization layer 117 to be electrically connected to the thin-film transistor TFT. A first opening OPa and a second opening OPb that expose the pixel electrode 121 and spaced apart from each other may be defined in the pixel definition layer 119. The intermediate layer including the emission layer 122*b*, and the counter electrode 123 may be arranged in the first and second openings OPa and OPb of the pixel definition layer 119. The 3-1 st sub-emission area EA3*a* and the 3-2nd sub-emission area EA3*b* may be respectively defined by the first opening OPa and the second opening OPb. As illustrated in FIG. 8, light emission in the 3-1st sub-emission area EA3*a* and the 33-2nd sub-emission area EA3*b* may be implemented by one pixel circuit PC.

FIGS. 9 to 11C are diagrams illustrating emission areas according to some embodiments.

In the case of a display panel using a color filter and a black matrix as an optical functional layer, due to the characteristics of the color filter, pixels emitting light of different colors may have different required aperture ratios. For example, as illustrated in FIG. 5, in the display panel, the third pixel PX3 may have a greater aperture ratio than the first pixel PX1 and the second pixel PX2.

Figure 9:
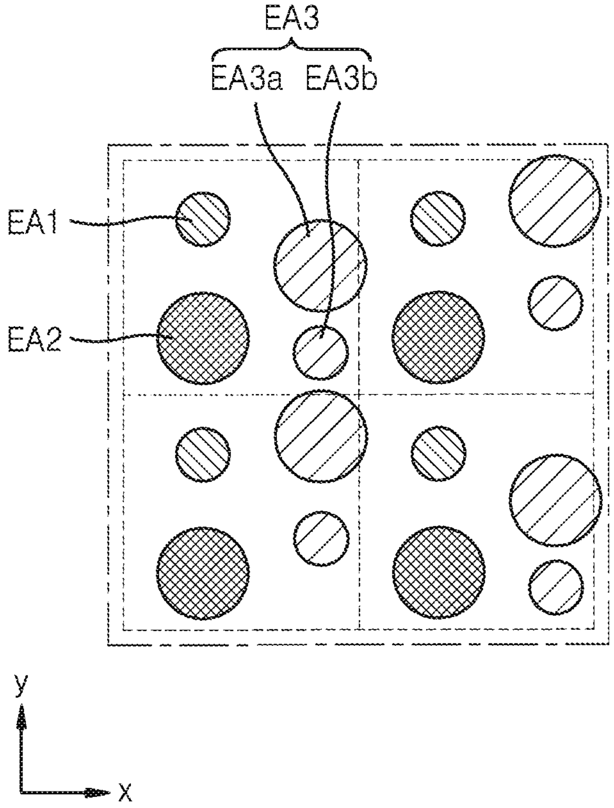
FIG. 9 is a diagram illustrating an arrangement of emission areas of pixels according to some embodiments.
Figure 10:
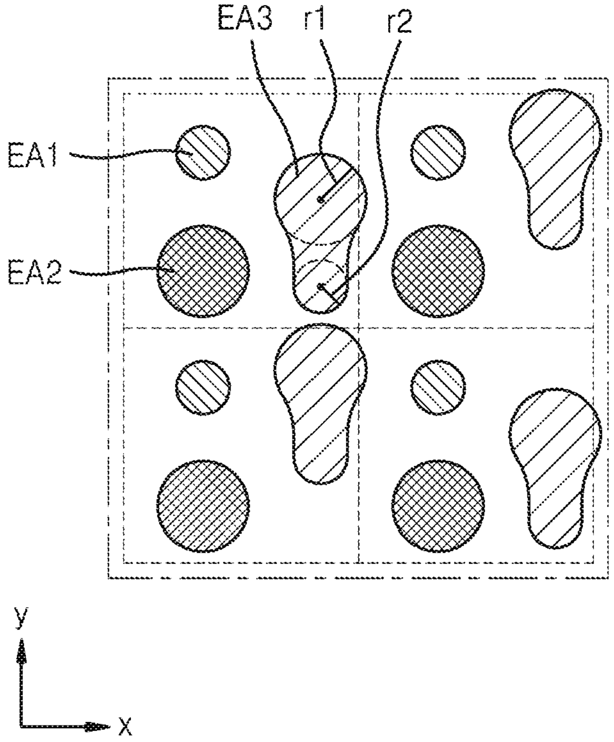
FIG. 10 is a diagram illustrating an arrangement of emission areas of pixels according to some embodiments.
Figure 11A:
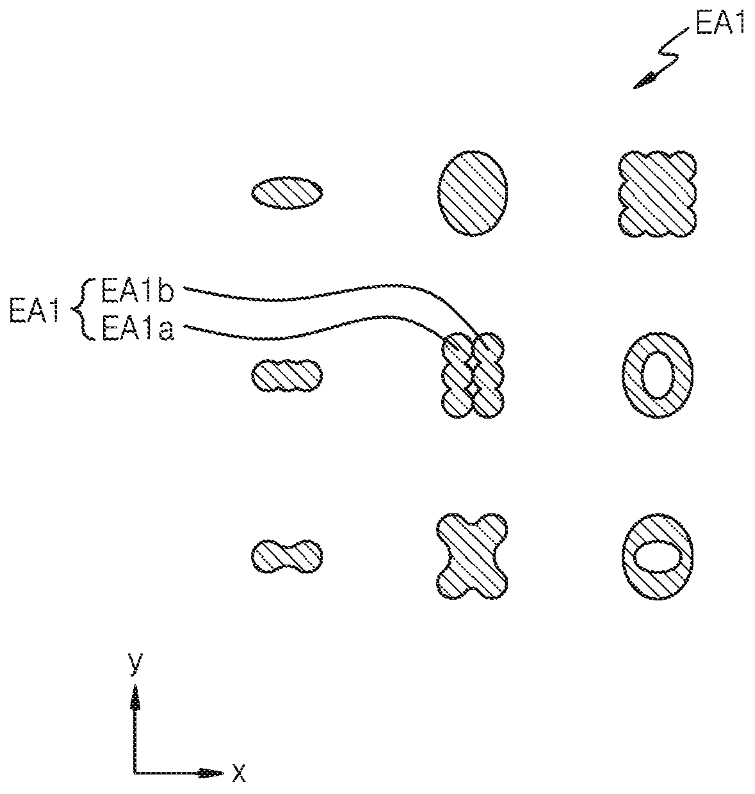
FIG. 11A is a diagram illustrating a modified example of first emission areas of a first pixel according to some embodiments.
Figure 11B:
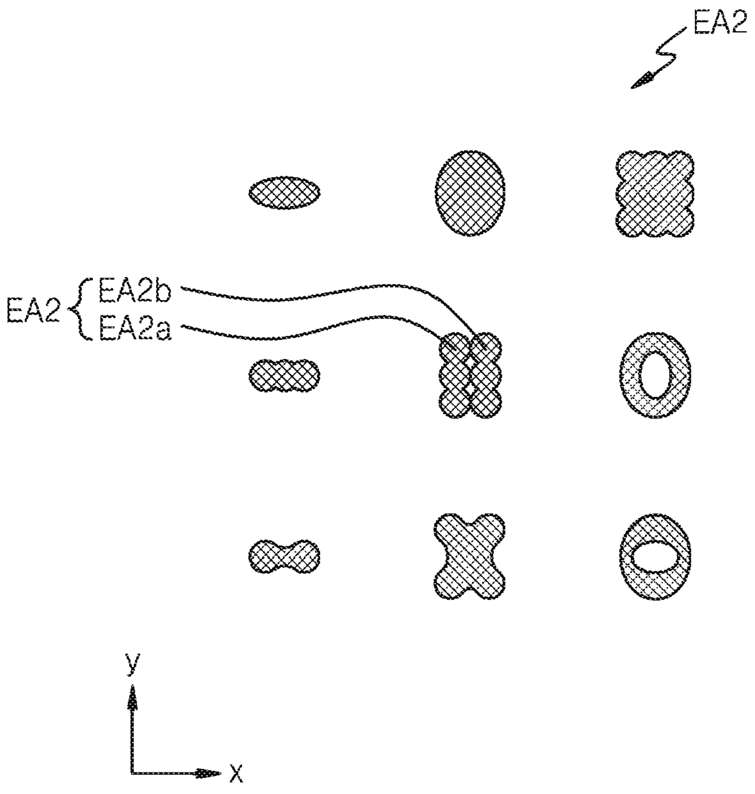
FIG. 11B is a diagram illustrating a modified example of second emission areas of a second pixel according to some embodiments.
Figure 11C:
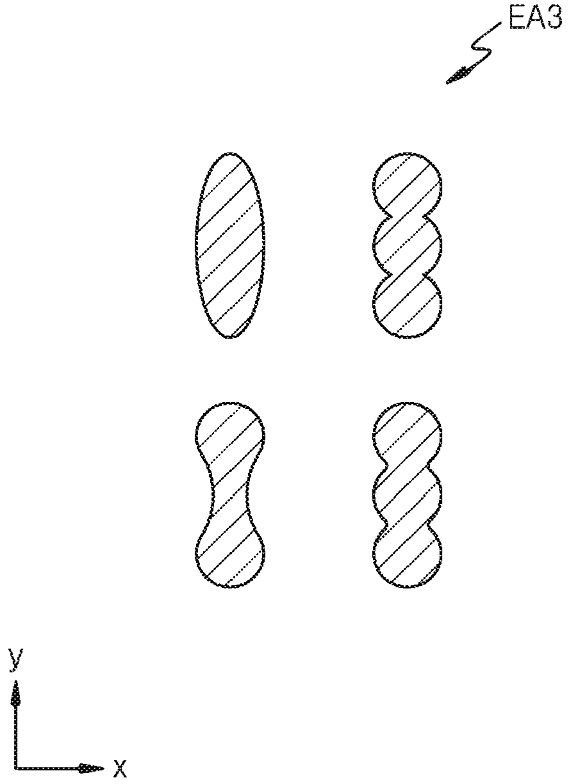
FIG. 11C is a diagram illustrating a modified example of third emission areas of a third pixel according to some embodiments.

As such, in a display panel having a pixel arrangement in which an aperture ratio between pixels is flexible, when a rectangular emission area is changed to a circular emission area, the aperture ratio may be lost. The embodiments of FIGS. 9 and 10 illustrate various modified examples of emission areas for reducing aperture ratio loss in the pixel arrangement illustrated in FIG. 5. FIG. 11A to 11C illustrate various modified examples of emission areas of each of the pixels illustrated in FIG. 5.

Referring to FIG. 9, the area of the first emission area EA1 of the first pixel may be less than the area of the second emission area EA2 of the second pixel. In this case, the 3-1 st sub-emission area EA3*a* of the third pixel, which is adjacent to the first emission area EA1, may be greater than the 3-2nd sub-emission area EA3*b* of the third pixel, which is adjacent to the second emission area EA2.

Referring to FIG. 10, the third emission area EA3 of the third pixel may not be provided as sub-emission areas that are apart from each other, but may be provided as a single emission area and have a closed curve shape rather than a circular shape. The third emission area EA3 may have a closed curve shape formed along outer edges of two circles of which centers are apart from each other. In this case, first and second radii r1 and r2 of the two circles may be different from each other.

The third emission area EA3 may be understood as having a non-circular closed curve shape in which the 3-1 st sub-emission area EA3*a* and the 3-2nd sub-emission area EA3*b* are connected to each other. In this case, the 3-1st sub-emission area may be inscribed in a circle having the first radius r1, and the 3-2nd sub-emission area may be inscribed in a circle having the second radius r2 that is smaller than the first radius r1, and thus, the third emission area EA3 may have an asymmetric dumbbell shape (peanut shape).

Referring to FIG. 11A, the first emission area EA1 of the first pixel may have an elliptical shape. The first emission area EA1 may have an elliptical shape having a long axis in the x direction or an elliptical shape having a long axis in the y direction. The first emission area EA1 of the first pixel may have a quadrangular shape having four curved concavo-convex sides and round corners. The first emission area EA1 of the first pixel may extend in the x direction, and may have a dumbbell-shaped closed curve shape having a concave center. Alternatively, the first emission area EA1 of the first pixel may extend in the x direction, and may have a curved concavo-convex shape at a central portion.

The first emission area EA1 of the first pixel may include a 1-1st sub-emission area EA1*a* and a 1-2nd sub-emission area EA b. In this case, each of the 1-1st sub-emission area EA1*a* and the 1-2nd sub-emission area EA b may extend in the y direction, and may have a curved concavo-convex shape at a central portion.

Alternatively, the first emission area EA1 of the first pixel may be an X-shaped closed curve having four convex portions that are convex in two diagonal directions intersecting each other at the center. Alternatively, the first emission area EA1 of the first pixel may have an annular shape (donut shape, e.g., a shape with an inner closed curve and an outer closed curve). In the annular shape, an inner shape and an outer shape may be different from each other. For example, the inner shape may be an ellipse having a long axis in the x direction, and the outer shape may be an ellipse having a long axis in the y direction.

Referring to FIG. 11B, like the first emission area EA1 of the first pixel, the second emission area EA2 of the second pixel may have various modified examples.

For example, the second emission area EA2 of the second pixel may have an elliptical shape. The second emission area EA2 may have an elliptical shape having a long axis in the x direction or an elliptical shape having a long axis in the y direction. The second emission area EA2 of the second pixel may have a quadrangular shape having four curved concavo-convex sides and round corners. The second emission area EA2 of the second pixel may extend in the x direction, and may have a dumbbell-shaped closed curve shape having a concave center. Alternatively, the second emission area EA2 of the second pixel may extend in the x direction, and may have a curved concavo-convex shape at a central portion.

The second emission area EA2 of the second pixel may include a 2-1st sub-emission area EA2*a* and a 2-2nd sub-emission area EA2*b*. In this case, each of the 2-1st sub-emission area EA2*a* and the 2-2nd sub-emission area EA2*b* may extend in the y direction, and may have a curved concavo-convex shape having convex and concave portions on sides in the y direction.

Alternatively, the second emission area EA2 of the second pixel may be an X-shaped closed curve having four convex portions that are convex in two diagonal directions intersecting each other at the center. Alternatively, the second emission area EA2 of the second pixel may have an annular shape (e.g., a donut shape). In the annular shape, an inner shape and an outer shape may be different from each other. For example, the inner shape may be an ellipse having a long axis in the x direction, and the outer shape may be an ellipse having a long axis in the y direction.

Referring to FIG. 11C, the third emission area EA3 of the third pixel may have an elliptical shape having a long axis in the y direction. The third emission area EA3 of the third pixel may extend in the y direction, and may have a dumbbell-shaped (peanut-shaped) closed curve shape having a concave center. The third emission area EA3 of the third pixel may extend in the y direction, and may have a closed curve shape having convex and concave portions on sides in the y direction and round corners.

The emission areas illustrated in FIG. 11A to 11C may be provided in various combinations. For example, the first emission area EA1 of the first pixel may have an elliptical shape having a long axis in the x direction, the second emission area EA2 of the second pixel may have a dumbbell shape extending in the x direction, the third emission area EA3 of the third pixel may have a closed curve shape extending in the y direction and having convex and concave portions on sides in the y direction, and various combinations may be possible.

FIGS. 12A to 14B are diagrams illustrating an arrangement of pixels according to embodiments.

Figure 12A:
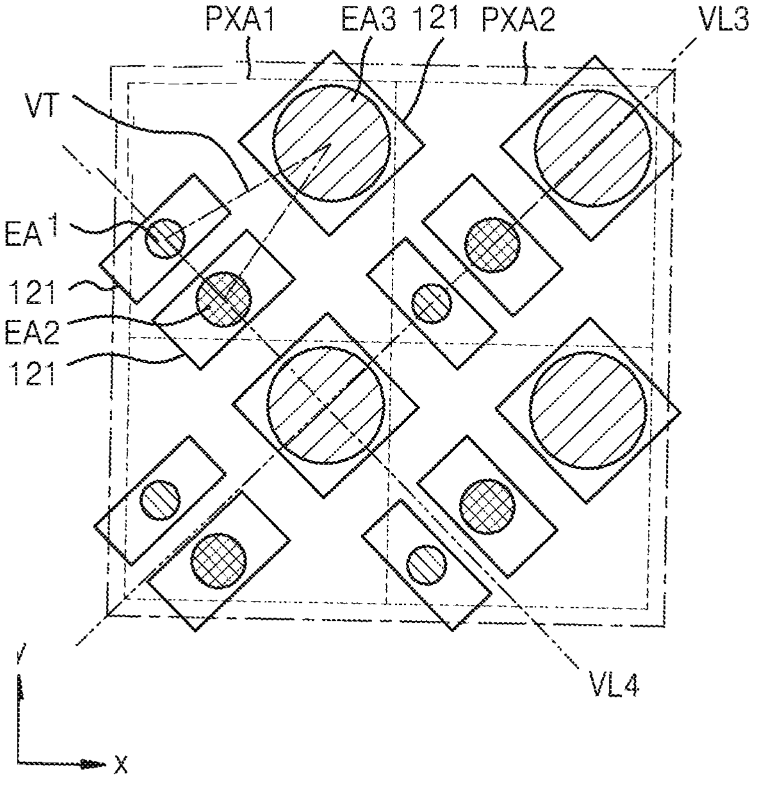
FIG. 12A is a diagram illustrating an arrangement of emission areas of pixels according to some embodiments.
Figure 12B:
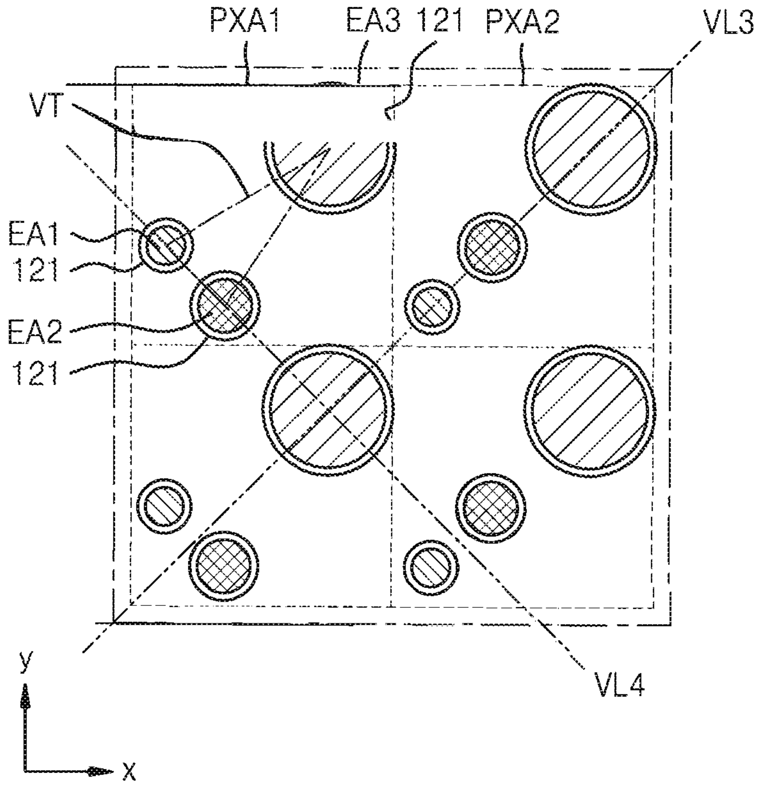
FIG. 12B is a diagram illustrating a modified example of a shape of a pixel electrode according to some embodiments as illustrated in FIG. 12A.

Referring to FIGS. 12A and 12B, in the display area DA, a first unit pixel area PXA1 and a second unit pixel area PXA2 may be alternately located in the x direction. In the first unit pixel area PXA1 and the second unit pixel area PXA2, the organic light-emitting diode OLED of the first pixel PX1, the organic light-emitting diode OLED of the second pixel PX2, and the organic light-emitting diode OLED of the third pixel PX3 may be arranged in a diagonal direction.

According to some embodiments, the first pixel PX1 may be a red pixel emitting red light, the second pixel PX2 may be a green pixel emitting green light, and the third pixel PX3 may be a blue pixel emitting blue light. The first pixel PX1, the second pixel PX2, and the third pixel PX3 may each include the organic light-emitting diode OLED, which is a display element, and a pixel circuit to which the organic light-emitting diode OLED is connected.

The first emission area EA1 corresponding to the organic light-emitting diode OLED of the first pixel PX1, the second emission area EA2 corresponding to the organic light-emitting diode OLED of the second pixel PX2, and the third emission area EA3 corresponding to the organic light-emitting diode OLED of the third pixel PX3 may each have a circular shape. The first emission area EA1 may have the smallest radius, the third emission area EA3 may have the largest radius, and the second emission area EA2 may have a radius that is larger than the radius of the first emission area EA1 and smaller than the radius of the third emission area EA3.

In the first unit pixel area PXA1, the first emission area EA1 of the first pixel PX1 and the second emission area EA2 of the second pixel PX2 may be arranged adjacent to each other along a fourth virtual straight line VL4 in a diagonal direction. The third emission area EA3 of the third pixel PX3 may be arranged adjacent to the first emission area EA1 of the first pixel PX1 and the second emission area EA2 of the second pixel PX2 along a third virtual straight line VL3 in a diagonal direction. In the first unit pixel area PXA1, centers of the first emission area EA1 of the first pixel PX1, the second emission area EA2 of the second pixel PX2, and the third emission area EA3 of the third pixel PX3 may be located at vertices of the virtual triangle VT.

In the second unit pixel area PXA2, the second emission area EA2 of the second pixel PX2 may be arranged between the first emission area EA1 of the first pixel PX1 and the third emission area EA3 of the third pixel PX3. In the second unit pixel area PXA2, centers of the first emission area EA1 of the first pixel PX1, the second emission area EA2 of the second pixel PX2, and the third emission area EA3 of the third pixel PX3 may be sequentially located or arranged along the third virtual straight line VL3.

According to some embodiments, each of the first emission area EA1, the second emission area EA2, and the third emission area EA3 may be arranged to correspond to one pixel electrode 121. According to some embodiments, as illustrated in FIG. 12A, the pixel electrode 121 may have a quadrangular shape. According to some embodiments, as illustrated in FIG. 12B, the pixel electrode 121 may have a shape similar to the shapes of the corresponding emission areas. For example, the pixel electrode 121 of the first pixel PX1, the pixel electrode 121 of the second pixel PX2, and the pixel electrode 121 of the third pixel PX3 may each have a circular shape larger than each emission area.

In addition, the size of the third emission area EA3 may be greater than the size of the first emission area EA1 and the size of the second emission area EA2. In the embodiments of FIGS. 12A and 12B, the first emission area EA1, the second emission area EA2, and the third emission area EA3 are each provided as one emission area corresponding to one pixel electrode 121, but embodiments according to the present disclosure are not limited thereto.

Figure 13A:
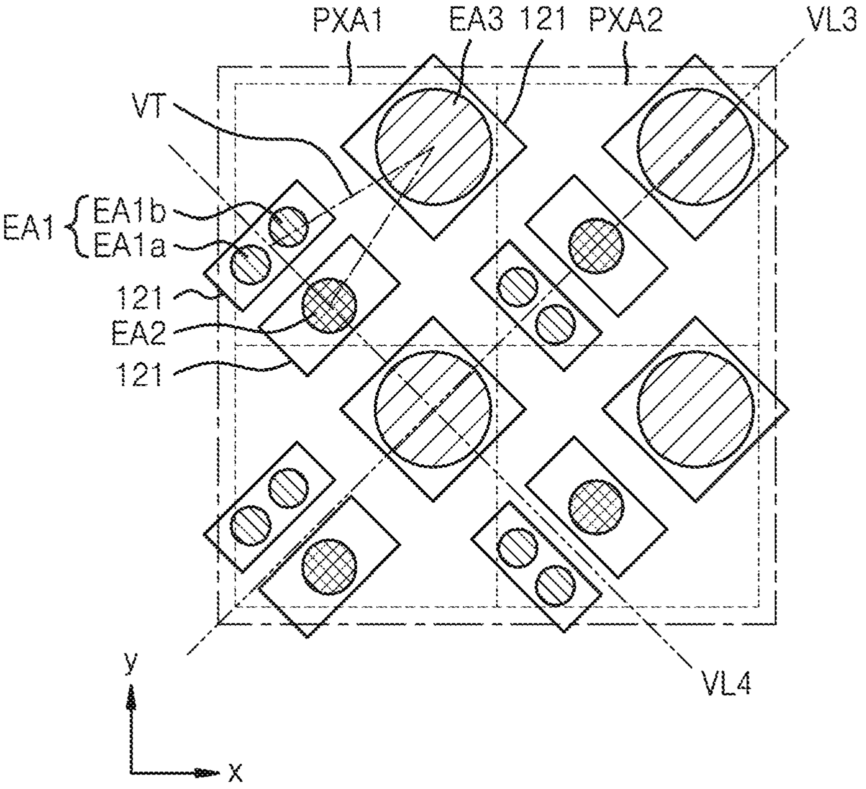
FIG. 13A is a diagram illustrating an arrangement of emission areas of pixels according to some embodiments.
Figure 13B:
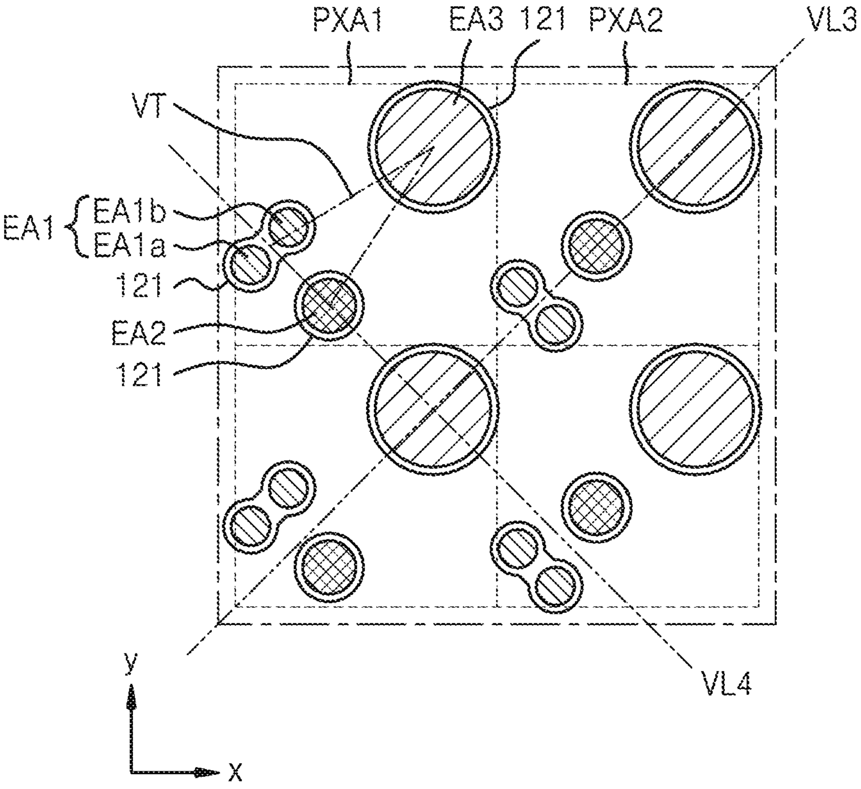
FIG. 13B is a diagram illustrating a modified example of a shape of a pixel electrode according to some embodiments as illustrated in FIG. 13A.

Referring to FIGS. 13A and 13B, the first emission area EA1 may include the 1-1st sub-emission area EA a and the 1-2nd sub-emission area EA b corresponding to one pixel electrode 121, and the 1-1st sub-emission area EA a and the 1-2nd sub-emission area EA b may each have a closed curve shape.

The 1-1st sub-emission area EA1*a* and the 1-2nd sub-emission area EA1*b* correspond to a first display element, and may emit the same color of light. For example, the 1-1$^{st}$ sub-emission area EA a and the 1-2$^{nd}$ sub-emission area EA b may emit red light.

In the first unit pixel area PXA1, the 1-1$^{st}$ sub-emission area EA1*a* and the 1-2$^{nd}$ sub-emission area EA b may be located on one pixel electrode 121, and may be arranged apart from each other with the fourth virtual straight line VL4 therebetween. The 1-1$^{st}$ sub-emission area EA a and the 1-2$^{nd}$ sub-emission area EA b may be arranged adjacent to each other in a diagonal direction of +45 degrees with respect to the x direction. A non-emission area may be arranged between the 1-1$^{st}$ sub-emission area EA a and the 1-2$^{nd}$ sub-emission area EA b. The 1-1$^{st}$ sub-emission area EA1*a* and the 1-2$^{nd}$ sub-emission area EA b may each have a circular shape.

In the second unit pixel area PXA2, the 1-1$^{st}$ sub-emission area EA1*a* and the 1-2$^{nd}$ sub-emission area EA b may be located on one pixel electrode 121, and may be arranged apart from each other with the third virtual straight line VL3 therebetween. The 1-1$^{st}$ sub-emission area EA a and the 1-2$^{nd}$ sub-emission area EA b may be arranged adjacent to each other in a diagonal direction of −45 degrees with respect to the x direction. A non-emission area may be arranged between the 1-1$^{st}$ sub-emission area EA a and the 1-2$^{nd}$ sub-emission area EA b. The 1-1$^{st}$ sub-emission area EA1*a* and the 1-2$^{nd}$ sub-emission area EA b may each have a circular shape.

According to some embodiments, as illustrated in FIG. 13A, the pixel electrode 121 may have a quadrangular shape. According to some embodiments, as illustrated in FIG. 13B, the pixel electrode 121 may have a shape similar to the shapes of the emission areas to which the pixel electrode 121 corresponds. For example, the pixel electrode 121 of the first pixel PX1 may have a dumbbell shape or a peanut shape having two circular shapes corresponding to the 1-1$^{st}$ sub-emission area EA1*a* and the 1-2$^{nd}$ sub-emission area EA1*b* and a bridge portion connecting the two circular shapes to each other. The pixel electrode 121 of the second pixel PX2 and the pixel electrode 121 of the third pixel PX3 may each have a circular shape larger than each emission area.

Figure 14A:
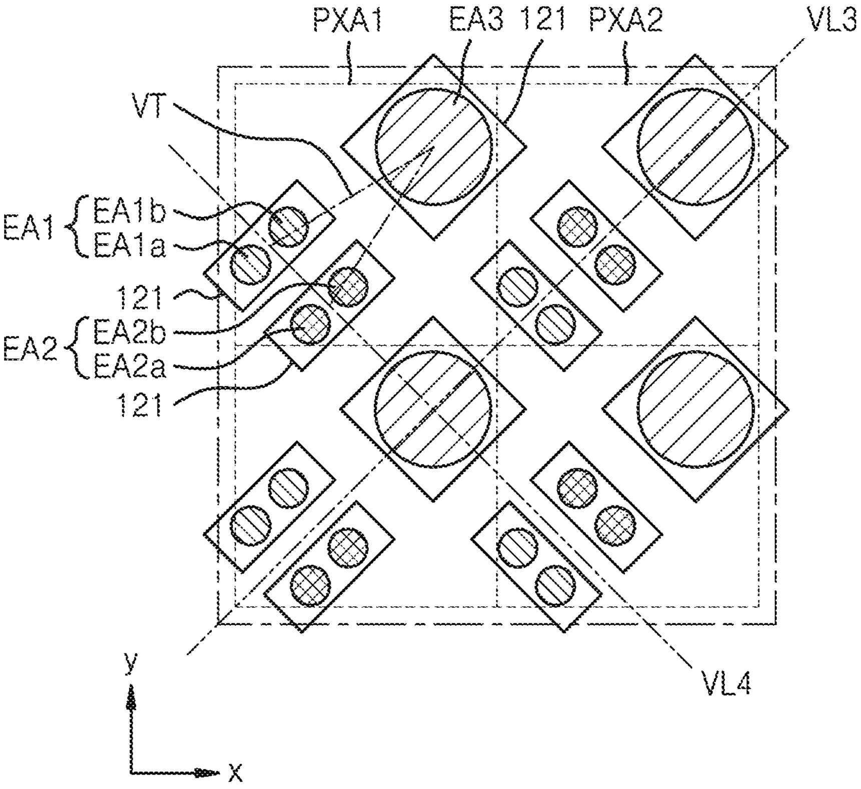
FIG. 14A is a diagram illustrating an arrangement of emission areas of pixels according to some embodiments.
Figure 14B:
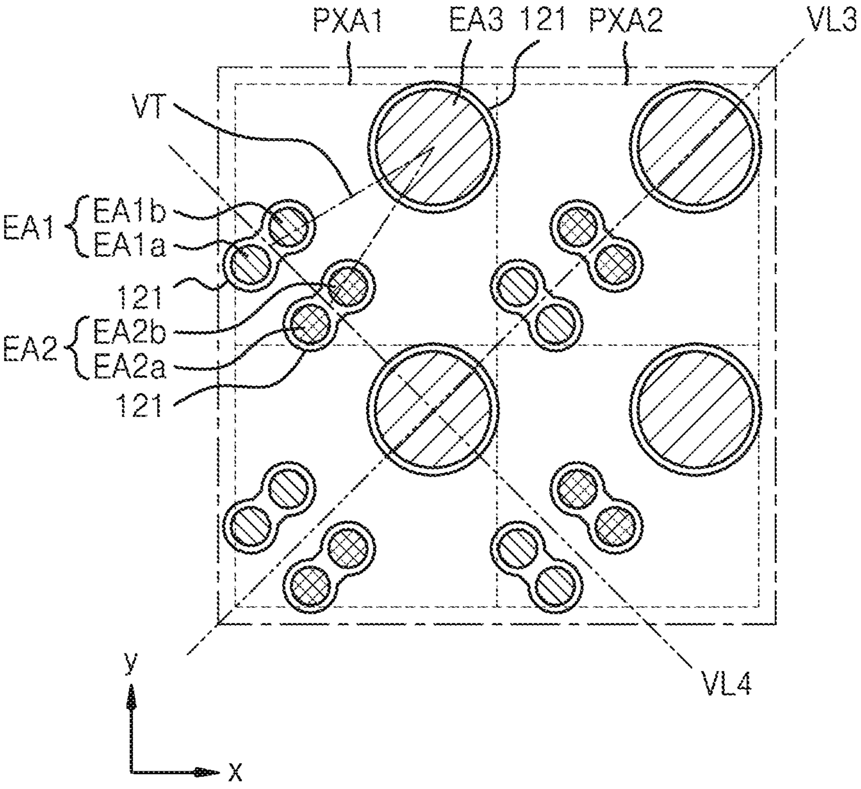
FIG. 14B is a diagram illustrating a modified example of a shape of a pixel electrode according to some embodiments as illustrated in FIG. 14A.

According to some embodiments, referring to FIGS. 14A and 14B, in addition to the first emission area EA1, the second emission area EA2 may also include the 2-1$^{st}$ sub-emission area EA2*a* and the 2-2$^{nd}$ sub-emission area EA2*b*.

The second emission area EA2 may include the 2-1$^{st}$ sub-emission area EA2*a* and the 2-2$^{nd}$ sub-emission area EA2*b* corresponding to one pixel electrode 121, and the 2-1$^{st}$ sub-emission area EA2*a* and the 2-2$^{nd}$ sub-emission area EA2*b* may each have a closed curve shape.

The 2-1$^{st}$ sub-emission area EA2*a* and the 2-2$^{nd}$ sub-emission area EA2*b* correspond to a second display element, and may emit the same color of light. For example, the 2-1 st sub-emission area EA2*a* and the 2-2nd sub-emission area EA2*b* may emit green light.

In the first unit pixel area PXA1, the 2-1st sub-emission area EA2*a* and the 2-2nd sub-emission area EA2*b* may be located on one pixel electrode 121, and may be arranged apart from each other with the fourth virtual straight line VL4 therebetween. The 2-1 st sub-emission area EA2*a* and the 2-2nd sub-emission area EA2*b* may be arranged adjacent to each other in a diagonal direction of +45 degrees with respect to the x direction. A non-emission area may be arranged between the 2-1st sub-emission area EA2*a* and the 2-2nd sub-emission area EA2*b*. The 2-1 st sub-emission area EA2*a* and the 2-2nd sub-emission area EA2*b* may each have a circular shape.

In the second unit pixel area PXA2, the 2-1st sub-emission area EA2*a* and the 2-2nd sub-emission area EA2*b* may be located on one pixel electrode 121, and may be arranged apart from each other with the third virtual straight line VL3 therebetween. The 2-1 st sub-emission area EA2*a* and the 2-2nd sub-emission area EA2*b* may be arranged adjacent to each other in a diagonal direction of −45 degrees with respect to the x direction. A non-emission area may be arranged between the 2-1st sub-emission area EA2*a* and the 2-2nd sub-emission area EA2*b*. The 2-1 st sub-emission area EA2*a* and the 2-2nd sub-emission area EA2*b* may each have a circular shape.

According to some embodiments, as illustrated in FIG. 14A, the pixel electrode 121 may have a quadrangular shape. According to some embodiments, as illustrated in FIG. 14B, the pixel electrode 121 may have a shape similar to the shapes of the emission areas to which the pixel electrode 121 corresponds. For example, the pixel electrode 121 of the first pixel PX1 may have a dumbbell shape or a peanut shape having two circular shapes corresponding to the 1-1st sub-emission area EA1*a* and the 1-2nd sub-emission area EA1*b* and a bridge portion connecting the two circular shapes to each other.

The pixel electrode 121 of the second pixel PX2 may have a dumbbell shape or a peanut shape having two circular shapes corresponding to the 2-1st sub-emission area EA2*a* and the 2-2nd sub-emission area EA2*b* and a bridge portion connecting the two circular shapes to each other.

The pixel electrode 121 of the third pixel PX3 may have a circular shape larger than the third emission area EA3.

Figure 15A:
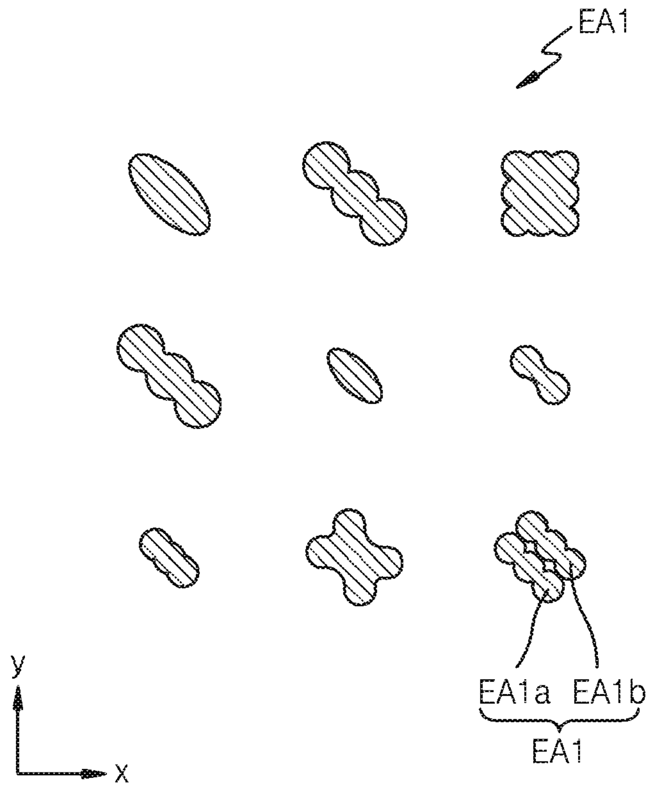
FIG. 15A is a diagram illustrating a modified example of first emission areas of a first pixel according to some embodiments.
Figure 15B:
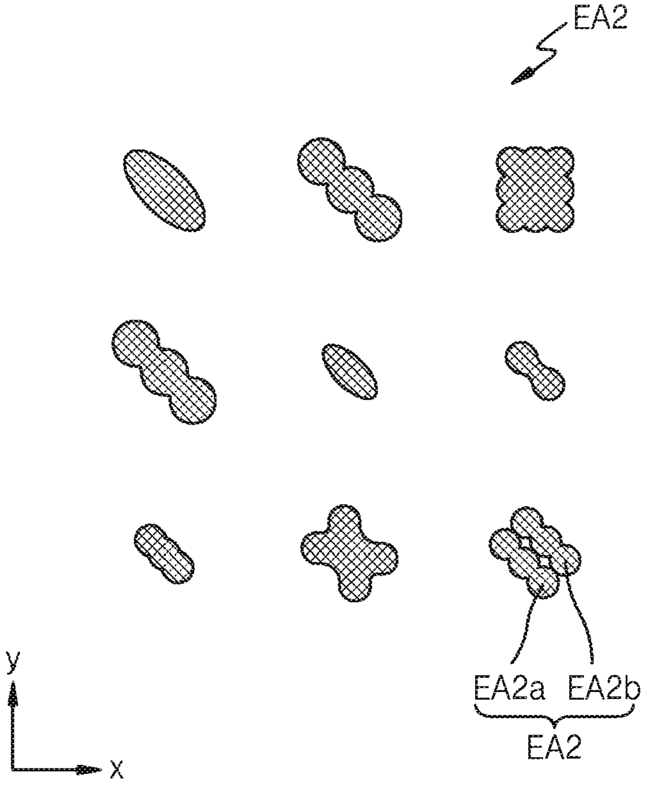
FIG. 15B is a diagram illustrating a modified example of second emission areas of a second pixel according to some embodiments.
Figure 15C:
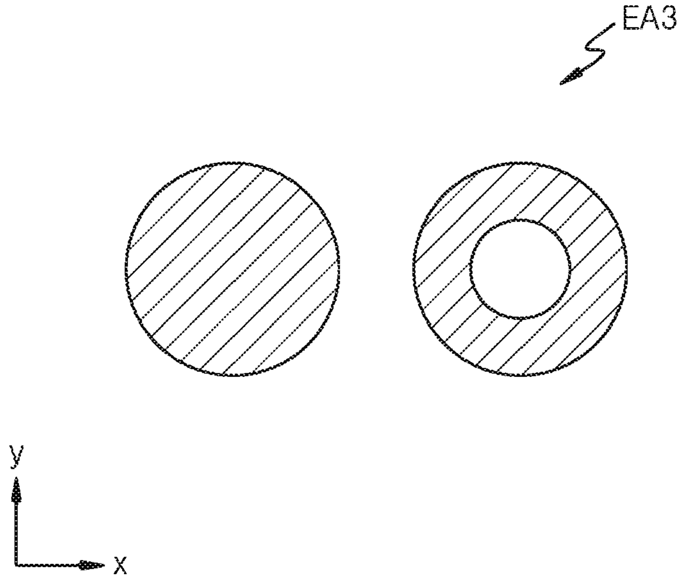
FIG. 15C is a diagram illustrating a modified example of third emission areas of a third pixel according to some embodiments.

FIGS. 15A to 15C illustrate various modified examples of the shapes of emission areas illustrated in FIGS. 12 to 14.

FIG. 15A illustrates modified examples of the first emission area EA1 corresponding to the first display element.

Referring to FIG. 15A, the first emission area EA1 of the first pixel may have an elliptical shape. The first emission area EA1 may have an elliptical shape having a long axis in a diagonal direction. The first emission area EA1 of the first pixel may extend in a diagonal direction, and may have a curved concavo-convex shape at a central portion. Alternatively, the first emission area EA1 of the first pixel may extend in a diagonal direction, and may have a dumbbell-shaped closed curve shape having a concave center. The first emission area EA1 of the first pixel may be an X-shaped closed curve having four convex portions that are convex in two diagonal directions intersecting each other at the center.

The first emission area EA1 of the first pixel may include the 1-1st sub-emission area EA1*a* and the 1-2nd sub-emission area EA1*b*. In this case, each of the 1-1st sub-emission area EA a and the 1-2nd sub-emission area EA b may extend in a diagonal direction, and may have a curved concavo-convex shape at a central portion. The size of the first emission area EA1 may be variously modified.

Referring to FIG. 15B, the second emission area EA2 of the second pixel may have an elliptical shape. The second emission area EA2 may have an elliptical shape having a long axis in a diagonal direction. The second emission area EA2 of the second pixel may extend in a diagonal direction, and may have a curved concavo-convex shape at a central portion. Alternatively, the second emission area EA2 of the second pixel may extend in a diagonal direction, and may have a dumbbell-shaped closed curve shape having a concave center. The second emission area EA2 of the second pixel may be an X-shaped closed curve having four convex portions that are convex in two diagonal directions intersecting each other at the center.

The second emission area EA2 of the second pixel may include the 2-1st sub-emission area EA2*a* and the 2-2nd sub-emission area EA2*b*. In this case, each of the 2-1st sub-emission area EA2*a* and the 2-2nd sub-emission area EA2*b* may extend in a diagonal direction, and may have a curved concavo-convex shape at a central portion. The size of the second emission area EA2 may be variously modified.

In FIGS. 15A and 15B, the first emission area EA1 and the second emission area EA2 each have a shape extending at −45 degrees with respect to the x direction, but the disclosure is not limited thereto. The first emission area EA1 and the second emission area EA2 may each have a shape extending by +45 degrees with respect to the x direction.

Referring to FIG. 15C, the third emission area EA3 may have a circular shape or an annular shape (donut shape). When the third emission area EA3 has an annular shape, both an inner shape and an outer shape may be circular. Alternatively, unlike the illustration, the third emission area EA3 may have various modifications, for example, may have different inner and outer shapes.

The emission areas illustrated in FIGS. 15A to 15C may be provided in various combinations. For example, the first emission area EA1 of the first pixel may have an elliptical shape having a long axis in a diagonal direction, the second emission area EA2 of the second pixel may have a dumbbell shape extending in a diagonal direction, the third emission area EA3 of the third pixel may have an annular shape, and various combinations may be possible.

An emission area according to embodiments may have a shape having reduced straight lines and curved edges, thereby reducing the occurrence of reflective color bands and diffraction phenomena.

Hereinbefore, for convenience, a display apparatus including an organic light-emitting diode as a display element has been described. However, embodiments may be applied to various types of display apparatuses such as a liquid crystal display apparatus, an electrophoretic display apparatus, and an inorganic electroluminescent (EL) display apparatus.

The display apparatus according to some embodiments may be implemented as an electronic apparatus such as a smartphone, a mobile phone, a smartwatch, a navigation device, a game console, a television (TV), a vehicle head unit, a notebook computer, a laptop computer, a tablet computer, a personal media player (PMP), or a personal digital assistant (PDA). In addition, the electronic apparatus may be a flexible apparatus.

According to embodiments, by implementing an emission area in a closed curve shape, a display apparatus with reduced aperture ratio loss and improved display quality may be provided. However, the scope of embodiments according to the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:

a unit pixel area defined along a first direction and a second direction that is perpendicular to the first direction, wherein, in the unit pixel area, a first display element configured to emit light of a first color and a second display element configured to emit light of a second color are arranged adjacent to each other along the first direction, and a third display element configured to emit light of a third color is arranged adjacent to the first display element and the second display element along the second direction, and a third emission area corresponding to the third display element comprises a 3-1st sub-emission area and a 3-2nd sub-emission area on one pixel electrode, and the 3-1st sub-emission area and the 3-2nd sub-emission area each have a closed curve shape.

2. The display panel of claim 1, wherein a first emission area corresponding to the first display element and a second emission area corresponding to the second display element each have a circular shape.

3. The display panel of claim 2, wherein a size of the first emission area is less than a size of the second emission area.

4. The display panel of claim 3, wherein the 3-1st sub-emission area is adjacent to the first emission area, and the 3-2nd sub-emission area is adjacent to the second emission area, and a size of the 3-1st sub-emission area is less than a size of the 3-2nd sub-emission area.

5. The display panel of claim 1, wherein a first emission area corresponding to the first display element and a second emission area corresponding to the second display element each have a non-circular closed curve shape.

6. The display panel of claim 1, wherein the 3-1st sub-emission area and the 3-2nd sub-emission area are connected to each other to form a non-circular closed curve shape.

7. The display panel of claim 6, wherein the 3-1st sub-emission area is inscribed in a circle having a first radius, and the 3-2nd sub-emission area is inscribed in a circle having a second radius that is smaller than the first radius, to form a dumbbell shape.

8. The display panel of claim 1, wherein a first emission area corresponding to the first display element comprises a 1-1st sub-emission area and a 1-2nd sub-emission area on one pixel electrode, and the 1-1st sub-emission area and the 1-2nd sub-emission area each have a closed curve shape.

9. The display panel of claim 1, wherein a second emission area corresponding to the second display element comprises a 2-1st sub-emission area and a 2-2nd sub-emission area on one pixel electrode, and the 2-1st sub-emission area and the 2-2nd sub-emission area each have a closed curve shape.

10. The display panel of claim 1, wherein the first color is red, the second color is green, and the third color is blue.

11. A display panel comprising:

a unit pixel area defined along a first direction and a second direction that is perpendicular to the first direction, wherein, in the unit pixel area, a first display element configured to emit light of a first color, a second display element configured to emit light of a second color, and a third display element configured to emit light of a third color are arranged along a diagonal direction relative to the first direction, and a first emission area corresponding to the first display element comprises a 1-1st sub-emission area and a 1-2nd sub-emission area on one pixel electrode to be apart from each other, and the 1-1st sub-emission area and the 1-2nd sub-emission area each have a closed curve shape.

12. The display panel of claim 11, wherein the 1-1st sub-emission area and the 1-2nd sub-emission area each have a circular shape.

13. The display panel of claim 11, wherein the 1-1st sub-emission area and the 1-2nd sub-emission area each have a non-circular closed curve shape.

14. The display panel of claim 11, wherein a second emission area corresponding to the second display element comprises a 2-1st sub-emission area and a 2-2nd sub-emission area on one pixel electrode to be apart from each other, and the 2-1st sub-emission area and the 2-2nd sub-emission area each have a closed curve shape.

15. The display panel of claim 14, wherein the 2-1st sub-emission area and the 2-2nd sub-emission area each have a circular shape.

16. The display panel of claim 14, wherein the 2-1st sub-emission area and the 2-2nd sub-emission area each have a non-circular closed curve shape.

17. The display panel of claim 11, wherein a size of a third emission area corresponding to the third display element is greater than a size of a second emission area corresponding to the second display element.

18. The display panel of claim 11, wherein a second emission area corresponding to the second display element has a non-circular closed curve shape.

19. The display panel of claim 11, wherein a third emission area corresponding to the third display element has a donut shape.

20. The display panel of claim 11, wherein the first color is red, the second color is green, and the third color is blue.

* * * * *